United States Patent [19]

Griffiths et al.

[11] Patent Number: 4,895,737
[45] Date of Patent: Jan. 23, 1990

[54] METAL-ORGANIC CHEMICAL VAPOR DEPOSITION

[75] Inventors: Richard J. M. Griffiths; Rodney R. Bradley, both of Duston, England

[73] Assignee: Plessey Overseas Limited, Ilford, England

[21] Appl. No.: 873,562

[22] Filed: Jun. 12, 1986

[30] Foreign Application Priority Data

Jun. 26, 1985 [GB] United Kingdom ............... 8516140
Jul. 20, 1985 [GB] United Kingdom ............... 8518351

[51] Int. Cl.$^4$ ..................... B05D 3/14; C23C 16/00
[52] U.S. Cl. ........................................ 427/50; 427/51;
427/126.1; 427/126.2; 427/262; 427/255.2;
427/264; 427/314; 437/225
[58] Field of Search ............... 427/50, 51, 126.1, 252,
427/126.2, 314.91, 294, 255.2; 118/715, 721,
724, 725, 728–730, 500, 502, 503; 437/225

[56] References Cited

U.S. PATENT DOCUMENTS

| | | | |
|---|---|---|---|
| 3,218,203 | 11/1965 | Ruehrwein | 148/175 |
| 3,637,434 | 1/1972 | Nakanuma et al. | 118/730 |
| 4,401,689 | 8/1983 | Ban | 427/50 |
| 4,436,769 | 3/1984 | Moss et al. | 427/252 |

Primary Examiner—Janyce Bell
Attorney, Agent, or Firm—Fleit, Jacobson, Cohn, Price, Holman & Stern

[57] ABSTRACT

An MOCVD deposition technique wherein the pressure of reagent vapors within the reaction vessel (1) is maintained at a reduced pressure in the range $10^{-2}$ to $\sim 10$ millibars and contained mounted substrates (15) are heated non-inductively e.g. by an electric resistance circumferential furnace (5). In the above pressure range, high diffusivity of the reagent vapors ensures exposure of the substrates (15) to a uniform reagent mixture. A large number of substrates (15) may be processed simultaneously. As heating is non-inductive, an inert mounting (17) can be utilized avoiding the introduction of contaminants (e.g. carbon) into the deposited film.

8 Claims, 1 Drawing Sheet

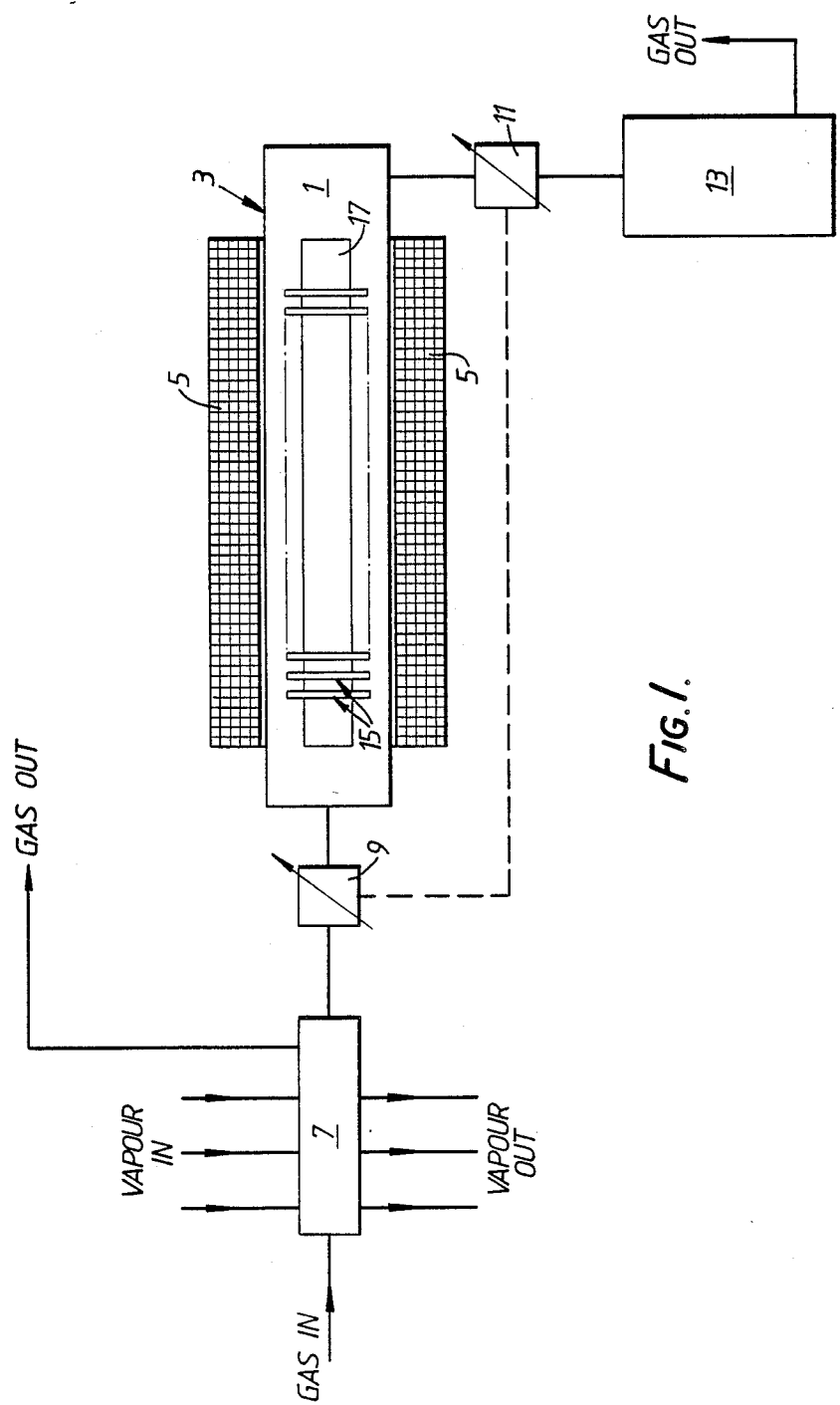
FIG. I.

METAL-ORGANIC CHEMICAL VAPOR DEPOSITION

TECHNICAL FIELD

The present invention concerns improvements in or relating to metal-organic chemical vapour deposition (MOCVD), and in particular it relates to a method of depositing compound semiconductor films.

In the process of metal-organic chemical vapour deposition, vapour-phase reagents are exposed to the surface of a heated substrate. At the heated surface the reagents react, depositing a solid-phase compound upon the substrate surface. The gaseous product of this reaction is removed, along with the unused vapour-phase reagents and carrier gas.

BACKGROUND ART

In the conventional process, the substrate is mounted upon a carbon susceptor and is heated by radio-frequency induction. The vapour-phase reagents are introduced, along with a chemically inert or reducing agent carrier gas—usually hydrogen, which is caused to flow over the surface of the heated substrate. When this process is applied to a number of substrates simultaneously, a high flow-rate is maintained to obviate problems of reagent depletion and to allow the deposition of uniformly thick compound films on the substrate. It is usual to conduct this process at normal pressures. Lower pressure operation is precluded because at such pressures plasma discharge will occur giving rise to reagent disassociation and the deposition of organic material.

Existing commercially available equipment for multi-wafer deposition is complex and expensive, and suffers from major drawbacks. Uniformity in layer thickness, doping and alloy composition is relatively poor and the consumption of reagents is unacceptably high. The use of radio-frequency induction heating requires bulky carbon susceptors, the latter limiting the number and size of substrates that can be used, and also introducing unwanted impurities in the vapour-phase which can become incorporated as undesirable dopants in the deposited film.

DISCLOSURE OF THE INVENTION

The present invention is intended as an alternative process to the foregoing, being less complex and relatively less expensive to impliment, whilst being capable of providing compound films of relatively uniform thickness.

In accordance with this invention there is provided a method of metal-organic chemical vapour deposition comprising the following steps:
  supporting one-or-more substrates on an inert mounting and holding same within a reaction vessel;
  applying heat to the walls of the reaction vessel to raise the one-or-more substrates to reaction temperature; and,
  exposing the one-or-more substrates to appropriate vapour-phase reagents at a reduced pressure in the range $10^{-2}$ millibars to pressure of the order of 10 millibars, to deposit a compound semiconductor film upon the surface of the one-or-more substrates.

Under the pressure conditions aforesaid the deposition rate becomes independent of the reactor geometry, and the decomposition process is surface controlled. The diffusivity of the reactants is high, but the mean free path is low, so that masking or shadowing effects are minimal, resulting in a uniform distribution and concentration of the reacting species over all the exposed surfaces in the reaction vessel.

The above method is applicable to the chemical vapour deposition of III-V, II-VI compounds and allied semiconductors eg. ternary and quaternary compound, using metal organic sources.

The reacting species, which are metal organic vapours (or group V~VI hydrides) are decomposed heterogeneously at the heated substrate surface. The high diffusivity of the reactants allows decomposition to take place over large numbers of substrates, stacked with only a few mms spacing between them within the reaction vessel, which is heated via either radiant heaters or a flat zone furnace, to give extremely uniform deposition over large surface area.

Conventionally in MOCVD, substrates are placed on a carbon block and heated by radio frequency induction. By using furnace heating, the carbon block, which is a source of contaminants, becomes unnecessary.

BRIEF INTRODUCTION OF THE DRAWING

The drawing accompanying this specification is a schematic illustration of apparatus suitable for performing the method of this invention.

DESCRIPTION OF EMBODIMENT

An Embodiment of the present invention will now be described, by way of example only, with reference to the accompanying drawing.

The apparatus shown FIG. 1, comprises a reaction vessel 1, the walls 3 of which are surrounded by a circumferential heater 5—an electric resistance furnace or bank of circumferentially disposed radiant heaters. Hydrogen or a chemically inert carries gas, e.g. helium, or a mixture of such gases, are admitted to the vessel 1 via a gas manifold 7 and an input flow control valve 9. This gas is vented from the reaction vessel via an output pressure control valve 11 and vacuum system 13. The pressure within the reaction vessel 1 is maintained at a predetermined reduced pressure in the range of $10^{-2}$ millibars to a pressure of the order of 10 millibars. The appropriate MOCVD reagents and, any dopant species are introduced into the carrier gas flow by means of the gas manifold 7. Wafer substrates 15 are held within the vessel 1 by a slotted mounting 17—e.g. a slotted glass material structure. As shown, the wafers 15 are mounted with their surfaces orthogonal to the direction of gas flow. However other directions of mounting may be used. This latter arrangement facilitates high density packing.

In this manner, gallium arsenide film may be grown using, for example, trimethyl-gallium (the group III metal-organic reagent) and arsine (a group V hydride reagent):

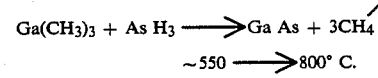

$$Ga(CH_3)_3 + As H_3 \longrightarrow Ga As + 3CH_4$$
$$\sim 550 \longrightarrow 800° C.$$

It will be appreciated that gallium arsenide may be deposited using alternative gallium-organic reagents and that other III-V compound films may be deposited using appropriate group III metal-organic and group V organic or hydride reagents.

Groups II-VI compound films may also be deposited by this method using the appropriate group II metal-organic and group VI organic or hydride. Thus, for example, zinc sulphide films may be grown using dimethyl zinc and hydrogen sulphide:

$$Zn(CH_3)_2 + H_2S \rightarrow ZnS + 2CH_4$$

These metal-organic vapour reactions are well known and will not be detailed further.

As stated above, deposition is performed at reduced pressure in the range $10^{-2}$ to a pressure of the order of 10 millibars. The upper limit ($\sim 10$ millibars) is defined to ensure that the deposition rate is uniform over the assembly of wafer substrates 15. Experimental evidence shows that reduced pressures of $1.5 \times 10$ and $2.0 \times 10$ millibars are effective. The lower limit ($10^{-2}$ millibars) is defined to limit the mean free path lengths to a length small compared with wafer dimensions and spacing. At greater mean free path lengths shadowing effects would dominate.

In the foregoing manner thick or thin films may be grown. These films may be either amorphous or crystalline depending on the nature of the surface of the substrates and flow conditions e.g. epitaxial thin film layers can be grown on a single crystal substrate.

Initial experiments have demonstrated that nominally undoped single crystal epitaxial layers of gallium arsenide can be prepared with carrier concentrations (n and p) below $10^{15}$ cm$^{-3}$, and with electron and hole mobilities which compare favourably with theoretically predicted values.

We claim:

1. A method of metal-organic chemical vapour deposition of compound semiconductor film, this method comprising:
supporting a multiplicity of spaced and stacked wafer substrates by means of an inert mounting and retaining same within a reaction vessel;
applying heat by external means, to the wall of the reaction vessel to raise the substrates to an appropriate reaction temperature; and,
admitting as a single gaseous stream, at one end of the reaction vessel, a carrier gas together with appropriate vapour-phase reagents (at least one of which reagents is metal organic), and extracting same at the other end thereof, whilst maintaining said reagents at a reduced pressure in the range $10^{-2}$ millibars to 10 millibars, approximately, to ensure uniform diffusion thereof, thereby to deposit a compound semiconductor film upon the exposed surface of each substrate.

2. A method, as claimed in claim 1, wherein the vapour-phase reagents comprise a group III metal-organic reagent and a group V metal-organic reagent.

3. A method, as claimed in claim 1, wherein the vapour-phase reagents comprise a group III metal-organic reagent and a group V hydride.

4. A method, as claimed in claim 3, wherein the vapour-phase reagents comprise trimethyl-gallium and arsine.

5. A method, as claimed in claim 1, wherein the vapour-phase reagents comprise a group II metal-organic reagent and a group VI metal-organic reagent.

6. A method, as claimed in claim 1, wherein the vapour-phase reagents comprise a group II metal-organic vapour and a group VI hydride.

7. A method, as claimed in claim 6, wherein the vapour-phase reagents comprise dimethyl zinc and hydrogen sulphide.

8. A method of metal-organic chemical vapour deposition of a compound semiconductor film, comprising the steps of:
supporting a multiplicity of spaced and stacked wafer substrates by means of an inert mounting and retaining the supported substrates and mounting within a reaction vessel;
applying heat by external means to the wall of the reaction vessel to raise the substrates to an appropriate reaction temperature;
admitting a carrier gas at one end of the reaction vessel via a gas manifold and an input flow control valve and venting the carrier gas from the other end of the reaction vessel via an output pressure control valve and vacuum system, the pressure within the reaction vessel being maintained at a reduced pressure in the range of about $10^{-2}$ millibars to 10 millibars; and
introducing appropriate vapour-phase reagents, at least one of said reagents being metal organic, into said carrier gas in the gas manifold and admitting the carrier gas together with the appropriate vapour-phase reagents as a single gaseous stream at said one end of the reaction vessel, while maintaining said reagents at a reduced pressure in the range of about $10^{-2}$ millibars to 10 millibars to ensure uniform diffusion thereof, thereby depositing a compound semiconductor film on the exposed surface of each of said substrates.

* * * * *